(12) United States Patent
Trifonov (10) Patent No.: US 10,691,156 B2
(45) Date of Patent: Jun. 23, 2020

(54) COMPLEMENTARY TO ABSOLUTE TEMPERATURE (CTAT) VOLTAGE GENERATOR

(71) Applicant: Texas Instruments Incorporated, Dallas, TX (US)

(72) Inventor: Dimitar Trifonov Trifonov, Vail, AZ (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 281 days.

(21) Appl. No.: 15/691,957

(22) Filed: Aug. 31, 2017

(65) Prior Publication Data

US 2019/0064868 A1 Feb. 28, 2019

(51) Int. Cl.
| | |
|---|---|
| *G01K 7/00* | (2006.01) |
| *G05F 3/30* | (2006.01) |
| *G05F 3/22* | (2006.01) |
| *H03K 3/282* | (2006.01) |

(52) U.S. Cl.
CPC ............... *G05F 3/30* (2013.01); *G05F 3/225* (2013.01); *H03K 3/2826* (2013.01)

(58) Field of Classification Search
USPC ..................................... 374/178, 163, 100
See application file for complete search history.

(56) References Cited

U.S. PATENT DOCUMENTS

| | | | |
|---|---|---|---|
| 2010/0127763 A1* | 5/2010 | Marinca ............... | G05F 3/30 327/539 |
| 2011/0260708 A1* | 10/2011 | Trifonov ............... | G05F 3/30 323/313 |

OTHER PUBLICATIONS

Mobarak et al. "Bandgap Reference: Basics," ECEN 607 (ESS) Texas A&M University, Feb. 10, 2005, pp. 1-27.

* cited by examiner

*Primary Examiner* — Mirellys Jagan
(74) *Attorney, Agent, or Firm* — John R. Pessetto; Charles A. Brill; Frank D. Cimino (57) ABSTRACT

Embodiments relate to a circuit including a first circuit branch, a second circuit branch, and an integrator circuit. The first branch includes a first transistor and a first current source to generate a first CTAT voltage signal that includes components corresponding to parasitic base and emitter resistances of the first transistor. The second branch includes a second transistor and a second current source to generate a second CTAT voltage signal that includes components corresponding to parasitic base and emitter resistances of the second transistor. The first and second circuit branches are coupled to the integrator circuit such that the integrator circuit integrates a difference between the first and second CTAT voltage signals such that the integrated signal does not include any components corresponding to parasitic base and emitter resistances.

18 Claims, 6 Drawing Sheets

COMPLEMENTARY TO ABSOLUTE TEMPERATURE (CTAT) VOLTAGE GENERATOR

TECHNICAL FIELD

This disclosure relates to voltage reference circuits and in particular to improving accuracy of complementary to absolute temperature (CTAT) voltages.

BACKGROUND

Complementary to absolute temperature (CTAT) voltages are widely used for construction of Band Gap references, temperature sensors, and bias generators. While CTAT voltages may be derived in many ways such as using complementary metal-oxide-semiconductor (CMOS) transistors, junction field-effect transistors (JFETs), and diodes, accurate and repeatable CTAT voltages are typically generated using bipolar junction transistors (BJTs or bipolar transistors). A CTAT voltage is generated using a BJT by configuring the BJT in a diode-connected mode of operation and generating the voltage across the base-emitter junction. The base-emitter voltage comprises various components that do not exhibit CTAT behavior and hence are imperfections of the CTAT voltage. Some of the imperfections may be are addressed by trimming or calibration techniques. But such techniques do not work well for imperfections such as parasitic base and emitter resistances that are embedded within the BJTs.

BRIEF DESCRIPTION OF THE DRAWINGS

Particular embodiments in accordance with the disclosure will now be described, by way of example only, and with reference to the accompanying drawings.

Other features of the present embodiments will be apparent from the accompanying drawings and from the detailed description that follows.

DETAILED DESCRIPTION

Embodiments of the present disclosure relate to a circuit that generates a CTAT voltage signal that does not include components corresponding to parasitic base and emitter resistances of the BJTs of the circuit. The circuit includes a first circuit branch, a second circuit branch, and an integrator circuit. The first branch includes a first transistor and a first current source, and generates a first CTAT voltage signal that includes components corresponding to parasitic base and emitter resistances of the first transistor. The second branch includes a second transistor and a second current source, and generates a second CTAT voltage signal that includes components corresponding to parasitic base and emitter resistances of the second transistor. The first and second transistors are selected to have the same dimensions such that the parasitic base and emitter resistances are also the same between the transistors. The first and second current sources are selected such that one of the two sources provides current that is twice as much as the other source. The first and second circuit branches are coupled to the integrator circuit such that the integrator circuit integrates a difference between the first and second CTAT voltage signals such that the integrated signal does not include any components corresponding to parasitic base and emitter resistances.

Figure 1:
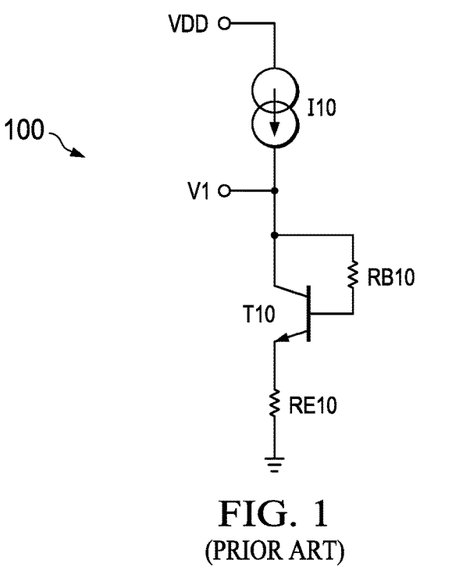
FIG. 1 is a block diagram of a conventional complementary to absolute temperature (CTAT) voltage generator circuit.

FIG. 1 is a block diagram of a conventional CTAT voltage generator circuit 100. A CTAT voltage signal may be generated using CMOS transistors, JFETs, diodes, or BJTs. Typically, CTAT voltage signals are generated by using BJTs such as T10 depicted in FIG. 1. T10 includes a base terminal, an emitter terminal, and a collector terminal. As shown in FIG. 1, the base terminal is directly connected to the collector terminal such that the BJT T10 is configured as a diode-connected BJT such that a voltage signal at the collector terminal is given by the voltage across the base-emitter junction. The resistors RB10 and RE10 represent parasitic base and emitter resistances of the BJT T10. A current source I10 is coupled between a reference voltage (e.g., power supply voltage VDD) and the collector terminal of T10. The voltage across the base-emitter junction of T10 is given by:

$$V1 = Vt * \ln\left(\frac{Ic}{Is}\right) + Ib * RB10 + Ie * RE10 \quad (1)$$

$$= Vt * \ln\left(\frac{\frac{\beta + I10}{1+\beta}}{Is}\right) + \frac{I10}{1+\beta} * RB10 + I10 * RE10$$

where Vt is the thermal voltage kT/q,
Ic is the collector current,
Is is the reverse saturation current,
Ib is the base current,
RB10 is the parasitic base resistance,
Ie is the emitter current,
RE10 is the parasitic emitter resistance, and
β is the forward common emitter current gain.

Equation 1 indicates that there are multiple sources of imperfections of the CTAT voltage across base-emitter junction. An imperfection may refer to any component of V1 that is not complementary to absolute temperature. According to equation 1, the imperfections include any variation of source current I10, any variation of β, the existence of parasitic base resistance RB10, the existence of parasitic emitter resistance RE10, and any variation in the reverse saturation current Is. This disclosure refers to techniques to reduce (and in some cases eliminate) the errors caused by the presence of parasitic base and emitter resistances RB10 and RE10, hereinafter referred to as error terms. An example technique to reduce the errors caused by the parasitic base and emitter resistances is described below with reference to FIG. 2.

Figure 2:
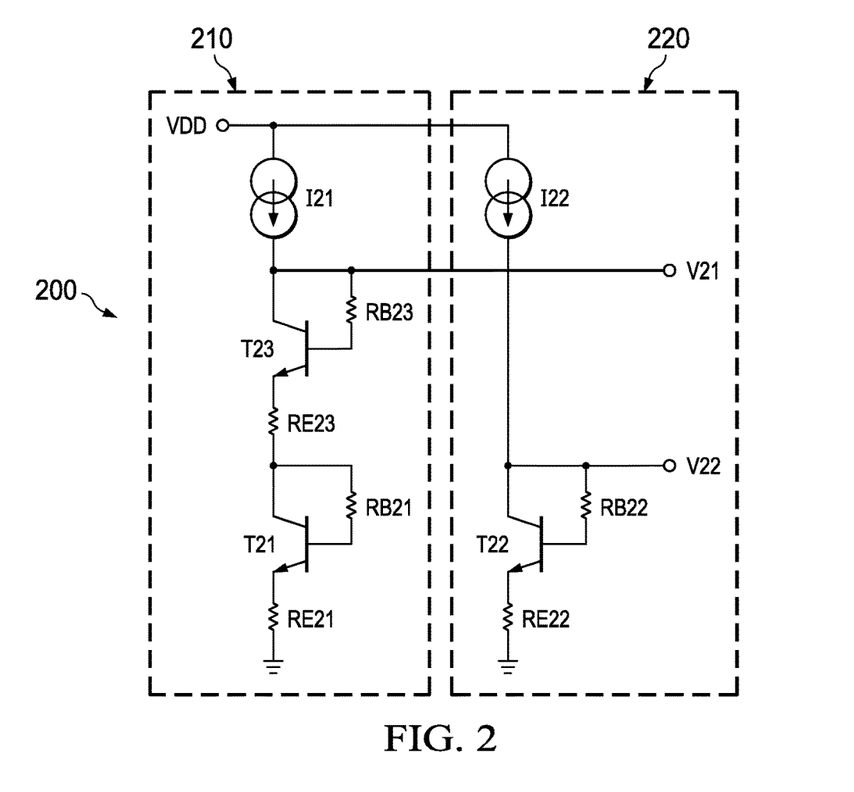
FIG. 2 is a block diagram of an improved CTAT voltage generator circuit, according to one embodiment.

FIG. 2 is a block diagram of an improved CTAT voltage generator circuit 200, according to one embodiment. The circuit 200 generates two CTAT voltage signals V21 and V22, which can be subtracted to produce an output CTAT voltage signal that substantially removes the error terms associated with parasitic base and emitter resistances. In an ideal scenario, the output CTAT voltage signal eliminates the error terms associated with parasitic base and emitter resistances. The circuit 200 includes two circuit branches 210 and 220. As shown in FIG. 2, circuit branch 210 includes two transistors T21 and T23, each configured in a diode-connected mode of operation, and a current source I21 providing current to the transistors T21 and T23. The transistors T21 and T23 (and every transistor described in this disclosure) include a base terminal, an emitter terminal, and a collector terminal. The transistors T21 and T23 are connected such that the base terminal of the second transistor T21 is connected to the collector terminal of T21, and also to the emitter terminal of the third transistor T23. The base terminal of the third transistor T23 is connected to the collector terminal of T23, which is also connected to the current source I21. The resistors RB21, RE21, RB23, and RE23 shown in the circuit branch 210 are not resistors added external to the transistors T21 and T23 but represent parasitic base and emitter resistances of the transistors T21 and T23. As described in this disclosure a transistor may refer to a BJT, a heterojunction bipolar transistor (HBT), a CMOS transistor, or the like that may be fabricated using semiconductors such as silicon, silicon germanium, gallium arsenide, and the like.

The circuit branch 220 includes transistor T22 configured in a diode-connected mode of operation and a current source I22 providing current to the transistor T22. The base terminal is connected directly to the collector terminal such that the transistor T22 is configured to operate as a diode-connected transistor. The resistors RB22 and RE22 shown in the circuit branch 220 are not resistors added external to the transistor T22 but represent parasitic base and emitter resistances of the transistor T22.

In an example implementation, the transistors T21, T22, and T23 have identical dimensions. For example, T21, T22, and T23 have the same dimensions such that they have the same current gain, β. Alternatively, the transistors T21, T22, and T23 have substantially same dimensions. For example, even when the transistors are intended to be manufactured with the same dimensions, the actual fabricated transistors might have almost same dimensions (and almost same β) but not exactly identical to each other. As an example, transistors with substantially same dimensions might refer to transistors with β value that is within a small percentage of each other such as 2% or 5%. If T21 has a β of 100, T22 and T23 might have a β in a range such as 90-110 due to process variations. In an example implementation, the current source I22 is designed to provide a current that is twice the amount of current provided by I21. Alternatively, different ratio between the current sources, the number of stacked transistors, and the size of the transistors may be used. For example, I22 may provide a current that is n times that of the current of I21, where n may be any integer greater than or equal to 2.

One technique to reduce the error terms due to parasitic base and emitter resistances is to generate a CTAT voltage signal by subtracting a first CTAT voltage signal generated by the first circuit branch 210 from a second CTAT voltage signal generated by the second circuit branch 220. The voltage signal V21 of the first circuit branch 210 generated at the collector terminal of T23 is given by:

$$V21 = Vt*\ln\left(\frac{Ic21}{Is}\right) + Ib21*RB21 + Ie21*RE21 + Vt*\ln\left(\frac{Ic23}{Is}\right) + \quad (2)$$
$$Ib23*RB23 + Ie23*RE23$$
$$= 2*\left[Vt*\ln\left(\frac{\frac{\beta + I21}{1+\beta}}{Is}\right) + \frac{I21}{1+\beta}*RB21 + I22*RE21\right]$$

where Vt is the thermal voltage kT/q,
Ic21 and Ic23 are the collector currents of T21 and T23 respectively,
Is is the reverse saturation current,
Ib21 and Ib23 are the base currents of T21 and T23 respectively,
RB21 and RB23 are the parasitic base resistances of T21 and T23 respectively,
Ie21 and Ie23 are the emitter currents of T21 and T23 respectively,
RE21 and RE23 are the parasitic emitter resistances of T21 and T23 respectively, and
β is the forward common emitter current gain of T21 and T23.

The voltage signal V22 of the second circuit branch 220 generated at the collector terminal of T22 is given by:

$$V22 = Vt*\ln\left(\frac{Ic22}{Is}\right) + Ib22*RB22 + Ie22*RE22 \quad (3)$$
$$= Vt*\ln\left(\frac{\frac{\beta*2*I21}{1+\beta}}{Is}\right) + \frac{2*I21}{1+\beta}*RB21 + 2*I21*RE21$$

where Vt is the thermal voltage kT/q,
Ic22 is the collector current of T22
Is is the reverse saturation current,
Ib22 is the base current of T22,
RB22 is the parasitic base resistance of T22,
Ie22 is the emitter current of T22,
RE22 is the parasitic emitter resistance of T22
β is the forward common emitter current gain of T22, and
I22=2*I21.

When the transistors T21, T22, and T23 are chosen to have identical (or substantially same) dimensions, the parasitic resistances are also substantially same between T21, T22, and T23. Alternatively, the parasitic resistances are identical between T21, T22, and T23. Assuming that the current gain β is same for transistors T21, T22, and T23, the error terms corresponding to the parasitic resistances in the voltage signal V21 (as given by equation 2) are same as the error terms corresponding to the parasitic resistances in the voltage signal V22 (as given by equation 3). An output CTAT voltage signal that eliminates these error terms may be generated by subtracting the voltage signals V21 and V2, as shown below in equation 4.

$$V21 - V22 = 2*\left[Vt*\ln\left(\frac{\frac{\beta*I21}{1+\beta}}{Is}\right)\right] - Vt*\ln\left(\frac{\frac{\beta*I21}{1+\beta}}{Is}\right) \quad (4)$$
$$= Vt*\ln\left(\frac{\frac{\beta*I21}{1+\beta}}{2*Is}\right)$$

An example circuit implementation for subtracting the two CTAT voltage signals being generated by the circuit branches 210 and 220 is described below with reference to FIGS. 3 and 4.

Figure 3:
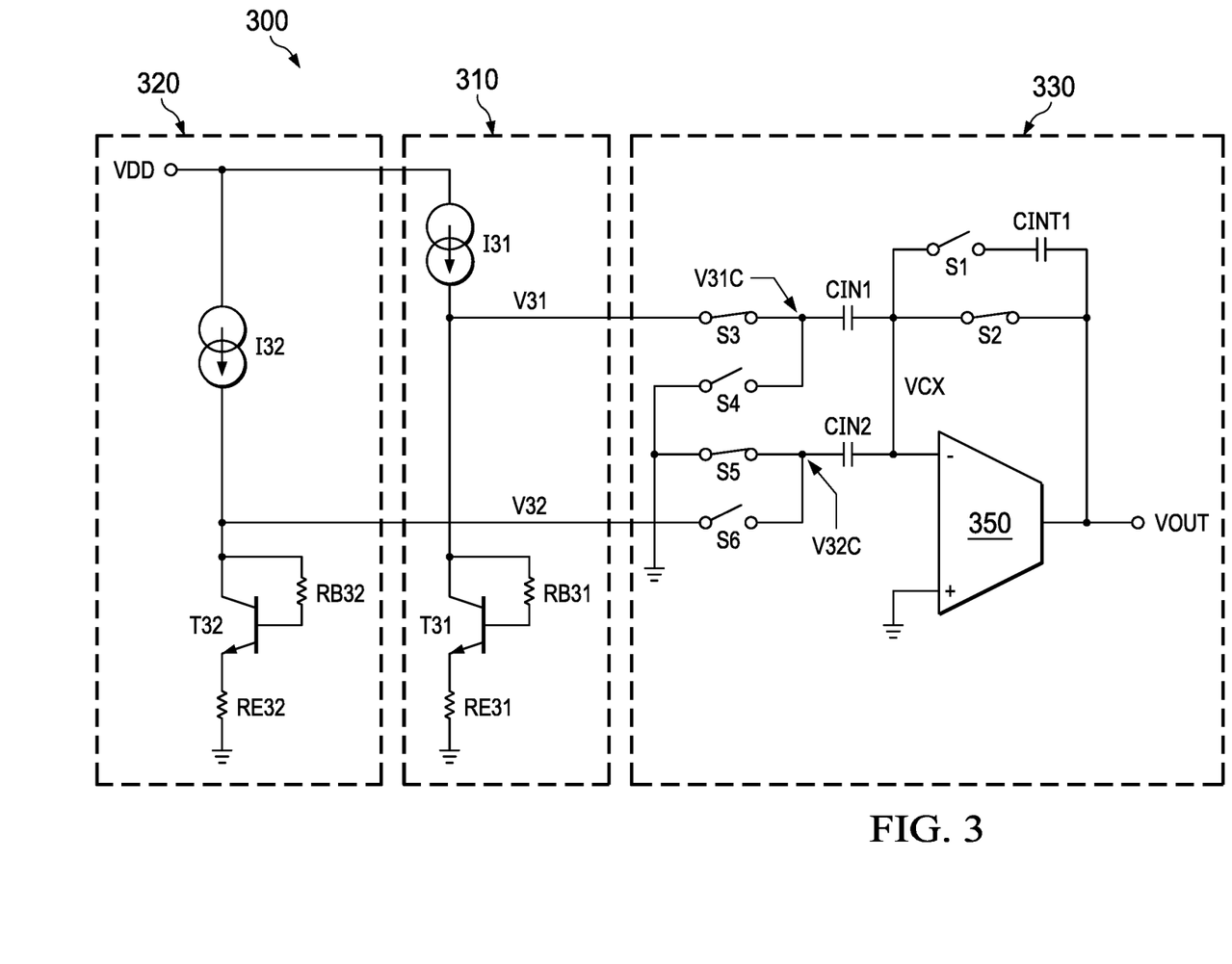
FIG. 3 is a block diagram of a single-ended CTAT voltage generator circuit being operated in a sampling mode, according to one embodiment.
Figure 4:
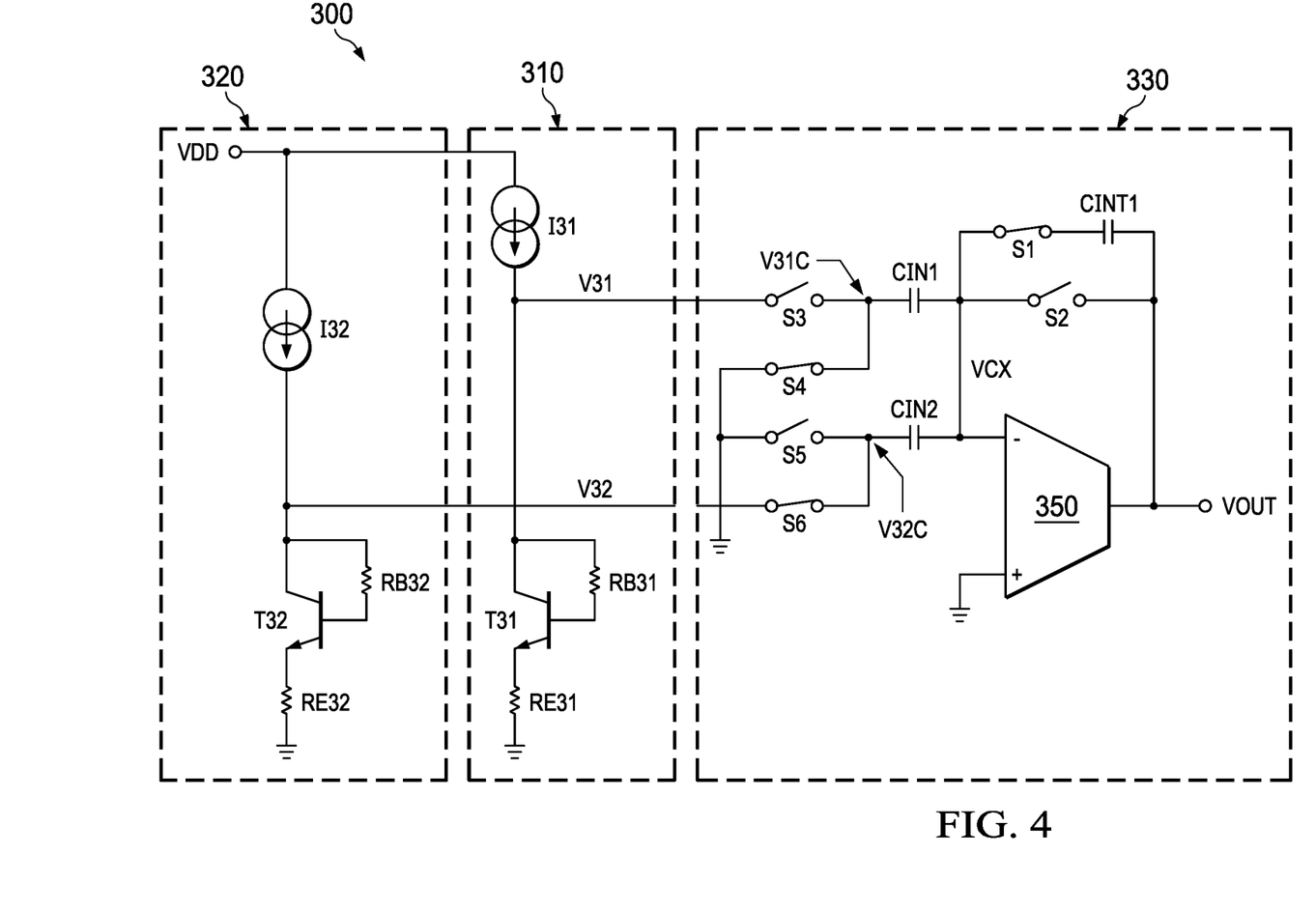
FIG. 4 is a block diagram of the single-ended CTAT voltage generator circuit of FIG. 3 being operated in an integrating mode, according to one embodiment.

FIG. 3 is a block diagram of a single-ended CTAT voltage generator circuit 300 being operated in a sampling mode, and FIG. 4 is a block diagram of the circuit 300 being operated in an integrating mode, according to one embodiment. The circuit 300 generates two CTAT voltage signal V31 and V32, which are subtracted to produce an output CTAT voltage signal VOUT that substantially removes the error terms associated with parasitic base and emitter resistances. The circuit 300 includes two circuit branches 310 and 320, and an integrator circuit 330 for generating the output CTAT voltage signal. The circuit branch 310 includes the transistor T31 configured in a diode-connected mode of operation and a current source I31 providing current to the transistor T31. The circuit branch 320 is similar to the branch 310 and includes the transistor T32 configured in a diode-connected mode of operation and a current source I32 providing current to the transistor T32. The transistors T31 and T32 are chosen to have identical (or substantially same) dimensions. The parasitic resistances and current gain β corresponding to T31 and T32 are also substantially same. In one example implementation, the current source I32 is designed to provide a current that is twice the amount of current provided by I31. Alternatively, different ratio between the current sources, the number of stacked transistors, and the size of the transistors may be used. For example, I32 may provide a current that is n times that of the current of I31, where n may be any integer greater than or equal to 2.

The circuit branches 310 and 320 are structurally similar to the circuit branch 220 of FIG. 2. The branches 310 and 320 are structurally identical except that the current source I32 is designed to provide a current that is twice the amount of provided by I31. The branches of circuit 300 are operated differently from that of circuit 200 as follows. For the purposes of explanation, the current provided by current sources I21 and I31 is Ix and provided by I22 and I32 is 2*Ix. In circuit 200, branch 210 includes two diode-connected transistors T21 and T23, and generates the CTAT voltage signal V21 when a current Ix flows through T21 and T23. V21 includes two error terms corresponding to each of the parasitic base resistances and parasitic emitter resistances. Branch 220 includes one diode-connected transistor T22, and generates the CTAT voltage signal V22 when a current of 2*Ix flows through T22. V22 includes one error term corresponding to each of parasitic base resistance and parasitic emitter resistance, where the one error term of V22 is equal in magnitude to that of the summation of the two error terms of V21, as shown in equations 2 and 3. When the voltage signals V21 and V22 are subtracted, the errors terms corresponding to the parasitic resistances cancel each other out resulting in a CTAT voltage signal that is free of such error terms as shown in equation 4. In summary, circuit 200 generates two CTAT voltage signals that have same error terms by using a branch that includes two diode-connected transistors carrying a current of Ix, and another branch that includes one diode-connected transistor carrying a current of 2*Ix.

In circuit 300, each of the two branches 310 and 320 have one diode-connected transistor but carry different currents. Transistor T31 of branch 310 carries Ix whereas T32 of branch 320 carries 2*Ix and accordingly, V32 is a larger voltage than V31. The voltage signal V32 of branch 320 generates the same error terms as that of V22 of branch 220.

In order to generate error terms of V31 that are same as that of V32, V31 may be sampled with twice the amount of capacitance when compared with the capacitance that samples V32, as described in the operation of the integrator 330 below.

Integrator 330 includes an operational amplifier 350, sampling capacitors CIN1 and CIN2, an integrating capacitor CINT1, and multiple switches S1-S6 to operate the integrator in different modes (or phases) of operation such as auto-zeroing mode and integrating mode. The integrator 330 provides an output CTAT voltage signal VOUT that is free of the error terms in each cycle of operation, where each cycle includes one auto-zeroing mode and one integrating mode. Integrator 330 is depicted as a single-ended circuit. Integrator 330 may be implemented as a differential circuit as shown in, for example, integrator 530 of FIG. 5 and integrator 730 of FIG. 7.

In the auto-zeroing mode, the integrator 330 samples voltage signal V31 using capacitors CIN1 and CIN2 in series, where the other end of the capacitor CIN2 is connected to a reference voltage such as ground. To enable the sampling of V31, switches S3 and S5 are turned on (or closed) and switches S4 and S6 are turned off (or opened). In the auto-zeroing mode, the integrating capacitor CINT1 is bypassed by turning on switch S2 and turning off switch S1. In this mode, the terminal of CIN1 coupled to the collector terminal of T31 (i.e., node labeled as V31c) via S3 has a voltage potential V31 and the terminal of CIN2 coupled to ground (i.e., node labeled as V32c) via S5 has a voltage potential zero (or the potential of the reference voltage). Capacitors CIN1 and CIN2 are selected based on the relationship between currents provided by current sources I31 and I32. For example, if I32 provides twice the current of I31, CIN1 has a capacitance value twice that of CIN2. Alternatively, if I32 provides n times the current of I31, CIN1 has a capacitance value n times that of CIN2, where n is an integer greater than or equal to 2. For the rest of this disclosure, it is assumed that I32 provides twice the current of I31 and CIN1 has a capacitance value twice that of CIN2 unless otherwise specified. In this embodiment, the voltage signals V31 and V32 are generated in different points of time. So it is possible to generate V31 and V32 using only one transistor, which will eliminate any errors due to mismatch between T31 and T32.

FIG. 4 shows the circuit 300 operating in the integrating mode. In the integrating mode, the switches S3 and S5 are turned off while the switches S4 and S6 are turned on, and switch S1 is turned on and S2 is turned off. The charging of the capacitors CIN1 and CIN2 changes such that the node V31c transitions from V31 to zero (or to the reference voltage) and the node V32c transitions from zero (or to the reference voltage) to V32. The capacitors CIN1 and CIN2 are charged in the integrating mode in a polarity opposite to the polarity of their charging in the auto-zeroing mode. The smaller capacitor CIN2 is now connected to the larger voltage V32, and the integrating capacitor CINT1 effectively integrates the difference between 2*V31 and V32. As described above with reference to FIG. 2, the error terms of 2*V31 are same as that of the errors terms of V32. The output voltage signal VOUT of the integrator 330 generates an effective CTAT voltage that is free from the error terms due to the parasitic base and emitter resistances. A differential integrator 430 is described below with reference to FIGS. 5 and 6.

Figure 5:
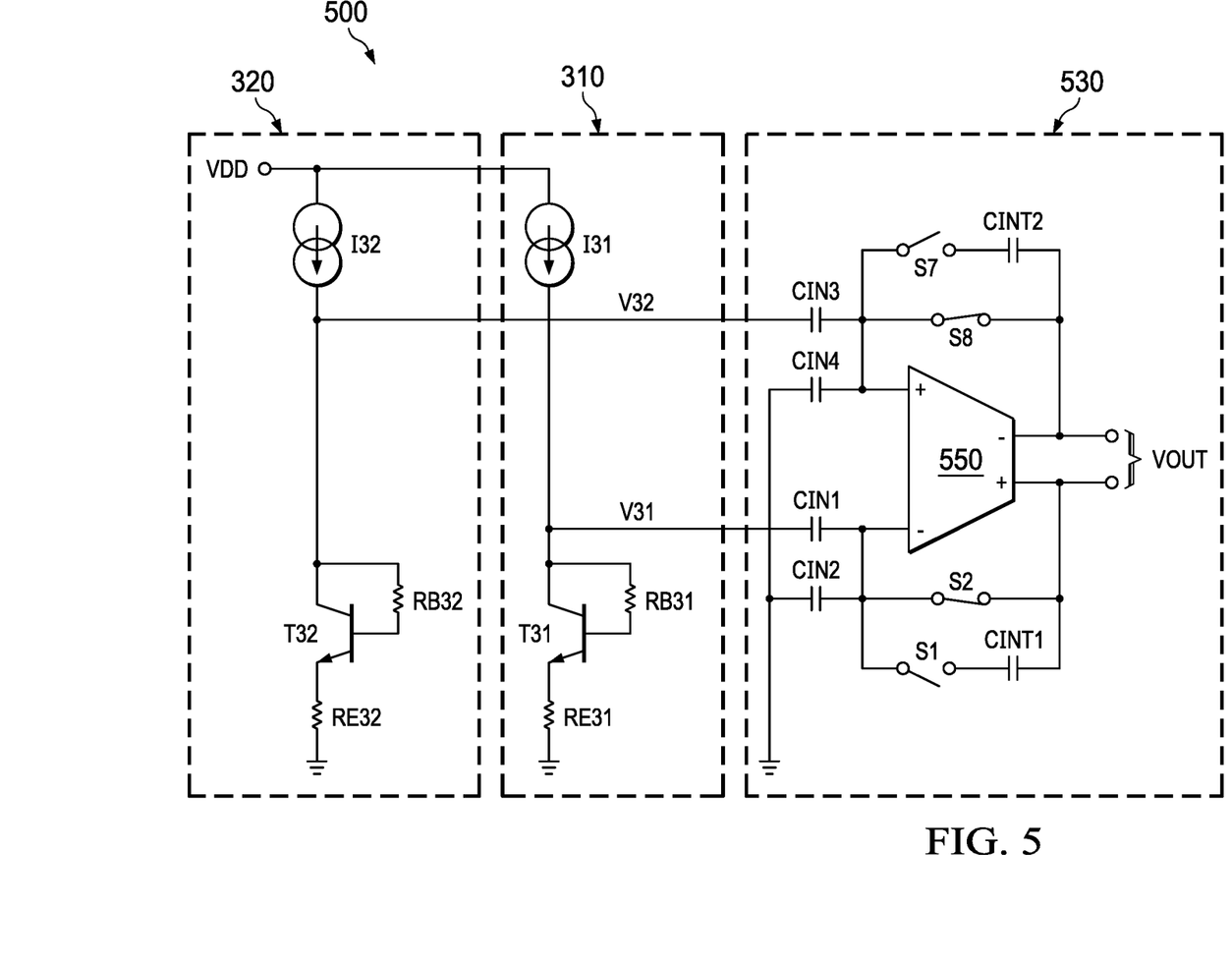
FIG. 5 is a block diagram of a differential CTAT voltage generator circuit being operated in the sampling mode, according to one embodiment.
Figure 6:
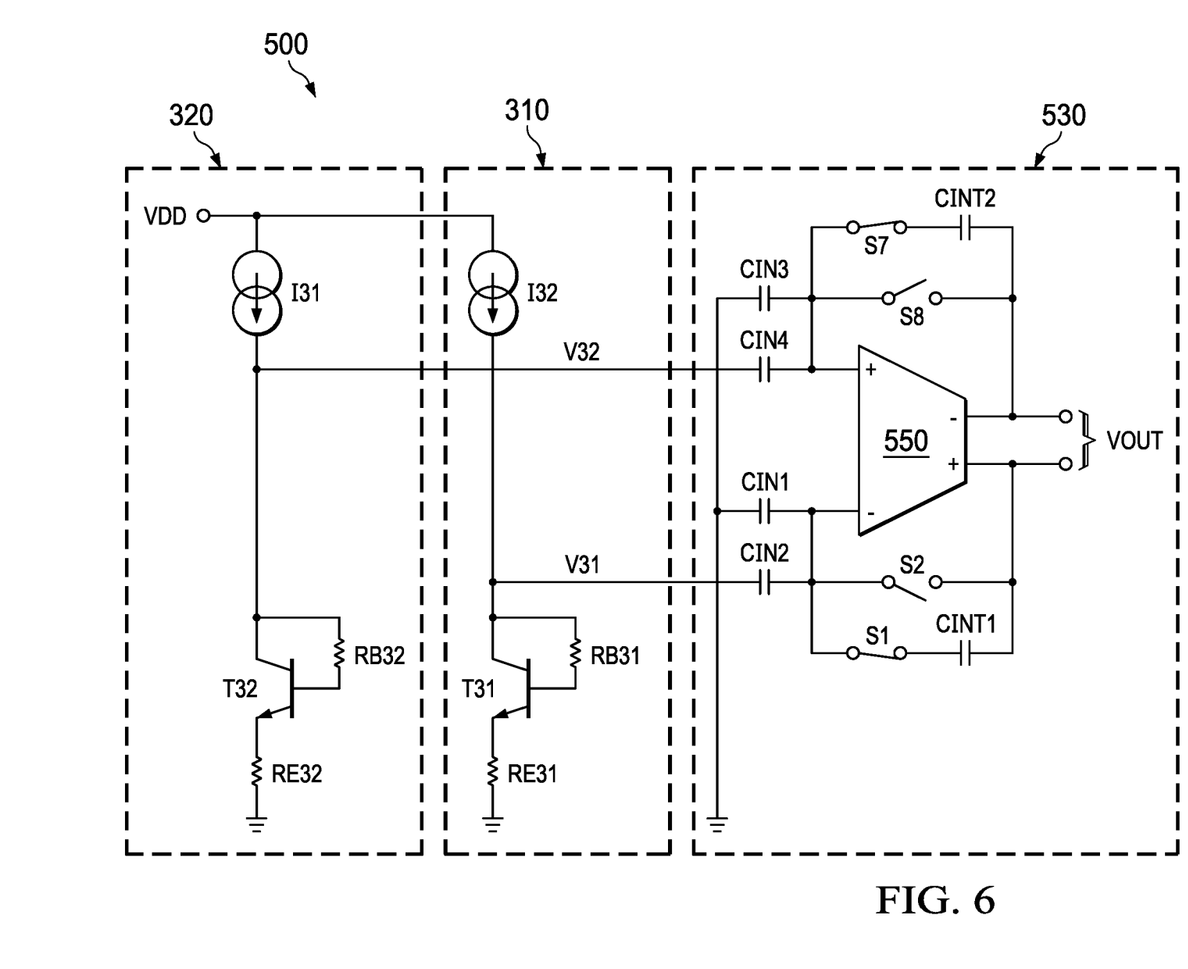
FIG. 6 is a block diagram of the differential CTAT voltage generator circuit of FIG. 5 being operated in the integrating mode, according to one embodiment.

FIG. 5 is a block diagram of a differential CTAT voltage generator circuit 500 being operated in the auto-zeroing mode, and FIG. 6 is a block diagram of the circuit 500 being operated in the integrating mode according to one embodiment. The circuit 500 includes the circuit branches 310 and 320, and an integrator 530 for generating the output CTAT voltage signal. The integrator 530 is similar to the integrator 330 except that integrator 530 is a differential implementation of the single-ended integrator 330. Differential integrator 530 has twice the number of sampling capacitors, integrating capacitors, and switches compared to the single-ended integrator 330. The opamp 550 of the integrator 530 is a fully differential implementation of the opamp 350. The circuit 500 and integrator 530 operate similar to that of circuit 300 and integrator 330 except that the current sources I31 and I32 are swapped between the auto-zeroing mode and the integrating mode as described below. For simplicity, the switches needed to swap the current sources and changing the capacitor connections in the two modes are not shown in FIGS. 5 and 6. An example circuit with all switches included is shown in circuit 700 of FIG. 7.

Referring back to FIG. 5, in the auto-zeroing mode, the integrator 530 samples voltage signal V31 using capacitors CIN1 and CIN2, and voltage signal V32 using capacitors CIN3 and CIN4. In the auto-zeroing mode, V31 is the smaller voltage and is generated by smaller current source I31 and transistor T31, and V32 is the larger voltage and is generated by larger current source I32 (twice that of I31) and transistor T32. The integrating capacitors CINT1 and CINT2 are bypassed by turning on switches S2 and S8, and turning off switches S1 and S7.

FIG. 6 shows the circuit 500 operating in the integrating mode. In the integrating mode, the switches S2 and S8 are turned off and switches S1 and S7 are turned on, and the current sources I31 and I32 are swapped. In this mode, V31 is the larger voltage and is generated by the larger current source I32 and transistor T31, and V32 is the smaller voltage and is generated by smaller current source I31 and transistor T32.

In the integrating mode, the input capacitors are switched such that the larger capacitors, CIN1 and CIN4 (which are twice the capacitance of CIN2 and CIN3), which are used to sample V31 in the auto-zeroing mode (i.e., smaller voltage in auto-zeroing mode) are now connected with opposite polarity to voltage V32 in the integrating mode (i.e., smaller voltage in integrating mode). This effectively integrates on the integrating capacitors CINT1 and CINT2 a two capacitor sample of the lower CTAT voltage created by the lower current source I31. The smaller input capacitors CIN2 and CIN3, which are used to sample V32 in auto-zeroing mode (i.e., larger voltage in auto-zeroing mode) are now connected with opposite polarity to voltage signal V31 in the integrating mode (i.e., larger voltage in integrating mode). This effectively integrates on the integration capacitors CINT1 and CINT2 a one capacitor sample of the higher CTAT voltage created by the larger current source I31, where I32=2I31. The two capacitor sample of the lower CTAT voltage and the one capacitor sample of the higher CTAT voltage are integrated in opposite directions and are effectively subtracted as given by equation 4. The output voltage VOUT is free from the error terms corresponding to the parasitic base and emitter resistances.

The output CTAT voltage signal VOUT also reduces any effect of mismatch between the transistors T31 and T32 because each of the transistors T31 and T32 is used to generate the lower CTAT voltage with I31 and the higher CTAT voltage with I32. The result is an effective chopping of the mismatch between the two bipolar transistors and reduces the mismatch between them. In some cases, the mismatch may be minimized or even eliminated.

Figure 7:
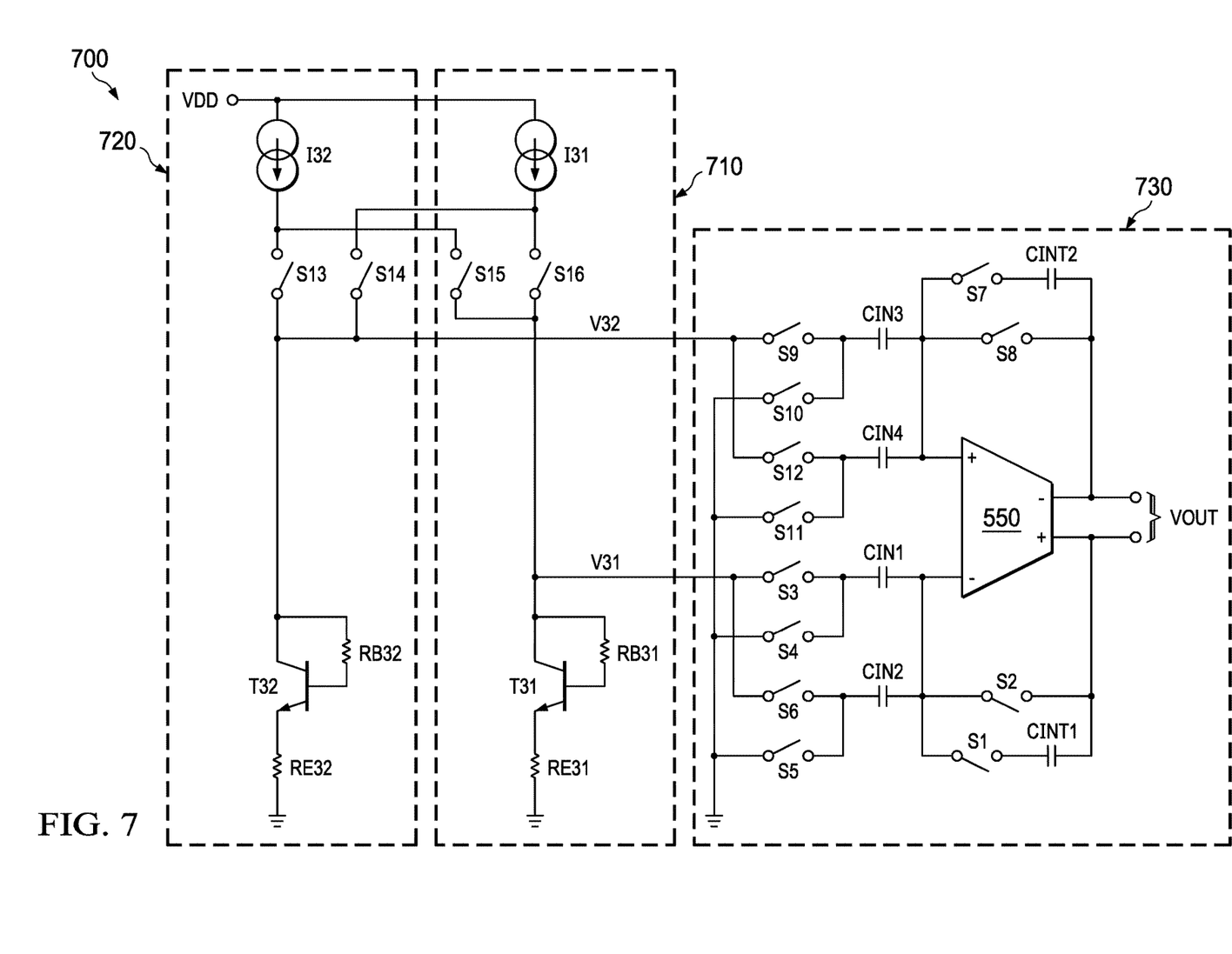
FIG. 7 is a block diagram of the differential CTAT voltage generator circuit of FIG. 5 with additional switches, according to one embodiment.

FIG. 7 is a block diagram of a differential CTAT voltage generator circuit 700, according to one embodiment. The circuit 700 is similar to the circuit 500 of FIG. 5 with additional switches added to show the switching of the current sources I31, I32, and the switching of input capacitors CIN1-CIN4. The circuit 700 includes the circuit branches 710 and 720, and an integrator circuit 730 for generating the output CTAT voltage signal. The integrator 730 is similar to the integrator 530 except that integrator 730 includes additional switches for switching the input capacitors CIN1-CIN4. The circuit branches 710 and 720 are similar to the branches 510 and 520 except that branches 710 and 720 include switches S13-S16 for switching the current sources I31 and I32. In the auto-zeroing mode, switches S2, S3, S5, S8, S9, S11, S13, and S16 are turned on, and S1, S4, S6, S7, S10, S12, S14, and S15 are turned off. In the integrating mode, switches S2, S3, S5, S8, S9, S11, S13, and S16 are turned off, and S1, S4, S6, S7, S10, S12, S14, and S15 are turned on.

In one example implementation, the larger current source I32 is implemented as two current sources in parallel (e.g., I32-1 and I32-2) and each such current source provides a current equal to that of I31. In such implementation, there would be three current sources, I31, I32-1, and I32-2, each providing identical amount of current. In consecutive cycles of operation of the integrator circuit 730, the current sources may be swapped such that any imperfection in the ratio of currents between I31 and I32 may be eliminated. For example, in the first cycle, the larger current is implemented using I32-1 and I32-2, and the smaller current using I31. In the second cycle that is immediately after the first cycle, the larger current is implemented using I32-1 and I31, and the smaller current using I32-2. In the third cycle that is immediately after the second cycle, the larger current is implemented using I32-2 and I31, and the smaller current using I32-1.

In one example implementation, the larger input capacitors, CIN1 and CIN4 is implemented as two capacitors in parallel (e.g., CIN1-1 and CIN1-2) and each such capacitor has a capacitance equal to that of the smaller capacitors CIN2 and CIN3. In such implementation, all input capacitors would have the same capacitance value. In consecutive cycles of operation of the circuit 700, the larger capacitors CIN1 and CIN4 are implemented using different combinations of the input capacitors such that any imperfection in the ratio of CIN1 and CIN2 (and/or CIN3 and CIN4) may be eliminated. For example, in the first cycle, the larger capacitor is implemented using a parallel combination of CIN1-1 and CIN1-2, and the smaller capacitor is CIN2. In the second cycle that is immediately after the first cycle, the larger capacitor is implemented using a parallel combination of CIN1-2 and CIN2, and the smaller capacitor is CIN1-1. In the third cycle that is immediately after the second cycle, the larger capacitor is implemented using a parallel combination of CIN1-1 and CIN2, and the smaller capacitor is CIN1-2.

Certain terms are used throughout the description and the claims to refer to particular system components. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection. It is therefore contemplated that the appended claims will cover any such modifications of the embodiments as fall within the true scope and spirit of the disclosure.

What is claimed is:

1. A circuit comprising:
a first circuit branch comprising a first transistor and a first current source, the first transistor comprising a base terminal, an emitter terminal, and a collector terminal; wherein the base terminal is connected to the collector terminal, the first current source is coupled to the collector terminal of the first transistor, and the first circuit branch is configured to generate a first complementary to absolute temperature (CTAT) voltage signal at the collector terminal of the first transistor;
a second circuit branch comprising a second transistor and a second current source, the second transistor comprising a base terminal, an emitter terminal, and a collector terminal; wherein the base terminal of the second transistor is connected to the collector terminal of the second transistor, the second current source is coupled to the collector terminal of the second transistor, the second circuit branch is configured to generate a second CTAT voltage signal at the collector terminal of the second transistor, the first and second transistors have substantially the same dimensions, and the first current source is configured to provide twice an amount of current provided by the second current source; and
an integrator circuit comprising an input terminal; wherein the input terminal is coupled to at least one of: the collector terminal of the first transistor and the collector terminal of the second transistor, and the integrator circuit is configured to generate an output CTAT voltage signal based on a difference between the first CTAT voltage signal and the second CTAT voltage signal.

2. The circuit of claim 1, wherein the first and second transistors have identical dimensions.

3. The circuit of claim 1, wherein the integrator circuit is implemented as a fully-differential circuit.

4. The circuit of claim 1, wherein each of the first circuit branch and the second circuit branch further comprises two switches, the first switch being coupled to the current source corresponding to the circuit branch and the collector terminal of the first transistor, and the second switch being coupled to the current source corresponding to the circuit branch and the collector terminal of the second transistor.

5. The circuit of claim 1, wherein the first circuit branch further comprises a third current source that is coupled to the collector terminal of the first transistor; wherein the third current source is configured to provide an amount of current that is the same as that of the amount of current provided by the second current source, and the first current source is further configured to provide an amount of current that is the same as that of the amount of current provided by the second current source.

6. The circuit of claim 5, wherein in a first cycle of operation, the first and third current sources are coupled to the collector terminal of the first transistor and the second current source is coupled to the collector terminal of the second transistor, and in a second cycle of operation immediately after the first cycle, the second and third current sources are coupled to the collector terminal of the first transistor and the first current source is coupled to the collector terminal of the second transistor.

7. The circuit of claim 6, wherein in a third cycle of operation immediately after the second cycle, the first and second current sources are coupled to the collector terminal of the first transistor and the third current source is coupled to the collector terminal of the second transistor.

8. The circuit of claim 1, wherein the integrator circuit is coupled to the collector terminal of the first transistor in a first mode of operation and to the collector terminal of the second transistor in a second mode of operation.

9. The circuit of claim 8, wherein the first mode of operation is a sampling mode and the second mode of operation is an integrating mode.

10. The circuit of claim 9, wherein the first current source is coupled to the collector terminal of the second transistor and the second current source is coupled to the collector terminal of the first transistor.

11. The circuit of claim 8, wherein the integrator circuit is coupled to the collector terminal of the first transistor via a first capacitor and a first switch, and to the collector terminal of the second transistor via a second capacitor and a second switch.

12. The circuit of claim 11, wherein the integrator circuit further comprises an amplifier circuit, the amplifier circuit comprising an input terminal, and wherein the first capacitor is coupled to the input terminal of the amplifier circuit and the first switch, the second capacitor is coupled to the input terminal of the amplifier circuit and the second switch, the first switch is coupled to the first capacitor and the collector terminal of the first transistor, and the second switch is coupled to the second capacitor and the collector terminal of the second transistor.

13. The circuit of claim 12, wherein a ratio between a value of capacitance of the first and second capacitors is based on a ratio of current provided by the first and second current sources.

14. The circuit of claim 12, wherein the integrator circuit further comprises a third switch and a fourth switch; wherein the third switch is coupled to the first capacitor and a reference node of the circuit, and the fourth switch is coupled to the second capacitor and the reference node.

15. The circuit of claim 14, wherein the integrator circuit further comprises an integrating capacitor coupled to the input terminal of the amplifier circuit and an output terminal of the integrator circuit.

16. The circuit of claim 15, wherein the integrator circuit further comprises a fifth switch coupled to the input terminal of the amplifier circuit and the integrating capacitor.

17. The circuit of claim 16, wherein the integrator circuit further comprises a sixth switch coupled to the input terminal of the amplifier circuit and the output terminal of the integrator circuit.

18. A circuit comprising:
a first circuit branch comprising a first transistor that is configured to generate a first complementary to absolute temperature (CTAT) voltage signal, the first CTAT voltage signal comprising components corresponding to parasitic base and emitter resistances of the first transistor;
a second circuit branch comprising a second transistor that is configured to generate a second CTAT voltage signal, the second CTAT voltage signal comprising components corresponding to parasitic base and emitter resistances of the second transistor, and the first transistor and the second transistor having substantially similar dimensions; and
an integrator circuit configured to generate an output CTAT voltage based on a difference between the first and second CTAT voltage signals.

* * * * *